US012604671B2

(12) United States Patent
Van Der Straten et al.

(10) Patent No.: US 12,604,671 B2
(45) Date of Patent: Apr. 14, 2026

(54) MAGNETIC TUNNEL JUNCTION STRUCTURE FOR MRAM

(71) Applicant: International Business Machines Corporation, Armonk, NY (US)

(72) Inventors: Oscar Van Der Straten, Guilderland Center, NY (US); Koichi Motoyama, Clifton Park, NY (US); Joseph F. Maniscalco, Greenville, SC (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 965 days.

(21) Appl. No.: 17/645,412

(22) Filed: Dec. 21, 2021

(65) Prior Publication Data

US 2023/0200255 A1 Jun. 22, 2023

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ................................ H10B 61/00; H10N 50/10
See application file for complete search history.

(56) References Cited

U.S. PATENT DOCUMENTS

| | | | |
|---|---|---|---|
| 7,910,906 B2 | 3/2011 | Lung | |
| 7,956,344 B2 | 6/2011 | Lung | |
| 8,084,760 B2 | 12/2011 | Lung et al. | |
| 8,796,795 B2 | 8/2014 | Satoh et al. | |
| 9,166,154 B2 | 10/2015 | Satoh et al. | |
| 9,502,640 B1 | 11/2016 | Annunziata et al. | |
| 10,069,064 B1 | 9/2018 | Haq et al. | |
| 10,541,268 B2 | 1/2020 | Gajek et al. | |
| 10,797,233 B2 | 10/2020 | Gajek et al. | |
| 2010/0311243 A1 | 12/2010 | Mao | |
| 2011/0133300 A1 | 6/2011 | Xiao et al. | |
| 2016/0351238 A1* | 12/2016 | Doyle | H10N 50/80 |
| 2018/0182747 A1* | 6/2018 | Kim | H10N 52/101 |
| 2021/0193205 A1* | 6/2021 | Pan | H10N 52/80 |
| 2021/0280776 A1* | 9/2021 | Frougier | H10N 50/80 |
| 2022/0359819 A1* | 11/2022 | Huang | H10B 61/00 |

* cited by examiner

*Primary Examiner* — Chad M Dicke
*Assistant Examiner* — Jeremy Daniel Watts
(74) *Attorney, Agent, or Firm* — Patterson + Sheridan, LLP

(57) ABSTRACT

Method and a magnetoresistive random access memory (MRAM) structure is provided. The structure includes an interconnect and a multilayered magnetic tunnel junction (MTJ) pillar located on the interconnect and having an outermost sidewall. The MTJ pillar includes an electrode layer electrically connecting the MTJ pillar to the interconnect. The electrode layer includes an insulative material at an outermost portion of the electrode layer and a conductive material at a first inner portion of the electrode layer disposed radially inward from the outermost portion of the electrode layer.

19 Claims, 13 Drawing Sheets

MAGNETIC TUNNEL JUNCTION STRUCTURE FOR MRAM

BACKGROUND

The present disclosure relates to electrode structures, and more specifically, to bottom electrode structures for magnetoresistive random-access memory (MRAM) devices.

Embedded MRAM structures can be used to replace embedded flash memory or embedded dynamic random access memory for its features of writing/reading speed, writing endurance, and low power consumption. High performance MRAM devices include perpendicular magnetic tunnel junction (MTJ) pillars with well-defined interfaces and interface control.

SUMMARY

According to some embodiments of the present disclosure, a magnetoresistive random access memory (MRAM) structure is provided. The structure includes an interconnect and a multilayered magnetic tunnel junction (MTJ) pillar located on the interconnect and having an outermost sidewall. The MTJ pillar includes an electrode layer electrically connecting the MTJ pillar to the interconnect. The electrode layer includes an insulative material at an outermost portion of the electrode layer and a conductive material at a first inner portion of the electrode layer disposed radially inward from the outermost portion of the electrode layer.

According to some embodiments of the present disclosure, a magnetoresistive random access memory (MRAM) structure is provided. The structure includes an interconnect and an electrode disposed on the interconnect. The electrode includes one or more conductive rings surrounded by a dielectric material at an outermost circumferential surface of an outermost conductive ring of the one or more conductive rings. A multilayered magnetic tunnel junction (MTJ) pillar is disposed on the electrode. The one or more conductive rings form an electrical connection between the MTJ pillar and interconnect.

According to some embodiments, a method of forming a magnetoresistive random access memory (MRAM) structure is provided. The method includes forming an electrode layer over an interconnect. The electrode includes one or more conductive rings surrounded by a dielectric material at an outer circumferential surface of the one or more rings. A multilayered magnetic tunnel junction (MTJ) pillar is formed on the electrode. The one or more conductive rings form an electrical connection between the MTJ pillar and interconnect.

DETAILED DESCRIPTION

Figure 1:
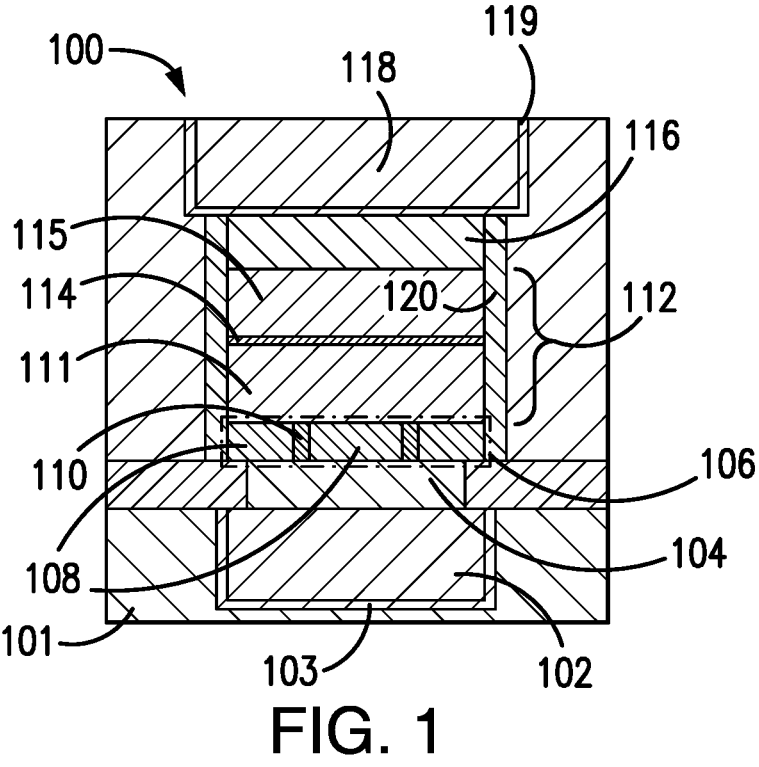
FIG. 1 depicts a schematic cross-sectional view of a MRAM structure having a bottom electrode with a single conductive ring according to some embodiments of the present disclosure.

MRAM devices include MTJ structures having multiple layers and well-defined interfaces. Embedded MRAM structures can be formed by patterning of the multiple layers. An MTJ device can include a synthetic anti-ferromagnetic layer, a reference layer, a free layer, and cap layers. Etching and processing the stacks have challenges that lead to shorts due to re-sputtering of conductive material from the patterned stacks to the MTJ stack sidewalls.

The MTJ structures are formed by removing portions of the layers such that the layers with removed portions together form an MTJ stack with at least one sidewall, such as a cylindrical stack. Removing portions of the layers of the MTJ structures can include processes such as reactive ion etching, ion beam etching, patterning (e.g., lithography), planarizing (e.g., by chemical mechanical polishing), or combinations thereof. Etching certain layers of the MTJ structure, such as conductive layers, can cause re-sputtering of conductive material from the conductive layers to the at least one sidewall of the stack. Having conductive material on the sidewall can cause electrical shorting of the final device. It has been discovered, as described herein, that layers (e.g., electrode layers) having conductive material can be formed by depositing the conductive material within the layer radially inward from the predetermined sidewall radius and surrounding the conductive material with a dielectric material to enable formation of electrical connections. Because the conductive material is recessed inward from the sidewall, during etching, the dielectric material of the electrode layer is etched instead of the conductive material. No, or substantially no re-sputtering of conductive material occurs, thereby eliminating or mitigating the risk of shorting. The conductive material can be in the form of one or more conductive rings embedded in dielectric material, such that the interface between the electrode layer and the MTJ is substantially uniform due to the thin thickness of the rings at the interface.

FIGS. 1 to 4 each depict a schematic cross-sectional view of various MRAM structures having bottom electrodes with conductive rings recessed away from the sidewall and peripherally surrounded by dielectric material. Each of the structures include a multilayered MTJ pillar disposed over a bottom electrode. Each of the layers described herein can be formed by a deposition process such as one or more of sputtering, atomic layer deposition, chemical vapor deposition, plasma enhanced chemical vapor deposition, physical vapor deposition, or combination(s) thereof. Following deposition, one or more of the layers can be further processed using an etchback process, a planarization process (e.g., chemical mechanical polishing), a patterning process (e.g., lithography and etching), or combination(s) thereof.

Each of the structures of FIGS. 1 to 4 include an interconnect 102. As used herein the term "interconnect"

describes an electrically conductive structure that can be composed of Cu, Al, Ta, TaN, Ti, TiN, Ru, RuN, RuTa, RuTaN, Co, CoWP, CON, W, WN, or combination(s) thereof. In some embodiments, the interconnect 102 is disposed within an interlayer dielectric (ILD) material 101 and has a top most surface that is coplanar with the ILD material. In some embodiments, the interconnect 102 is embedded in a liner 103. A metal cap layer 104 is disposed over the interconnect 102. In some embodiments, the metal cap layer 104 is composed of Ta, TaN, Ti, TiN, Ru, W, or combination(s) thereof.

A multilayered MTJ pillar 112 is located on metal cap layer 104 and the interconnect 102. In one embodiment, the MTJ pillar 112 is cylindrical having an outermost sidewall. The layers in the MTJ pillar 112 can include a reference layer 111, such as a CoFeB-containing layer, a tunnel barrier 114, such as a MgO-containing layer, and a free layer 115, such as CoFeB-containing layer. Although not shown, other layers are also contemplated, such as cap layers composed of Ta, Ru, or combination thereof. A hard mask 116 is disposed over the MTJ pillar 112, and a top electrode 118 is disposed over the hard mask 116. A dielectric encapsulation layer 120 surrounds the outermost sidewall of the MTJ pillar 112. In some embodiments, the top electrode 118 is composed of Cu, Al, W, or combination(s) thereof. In some embodiments, the top electrode 118 is embedded in a top electrode liner 119 composed of TaN, Ta, Ti, TiN, or combinations thereof.

Figure 2:
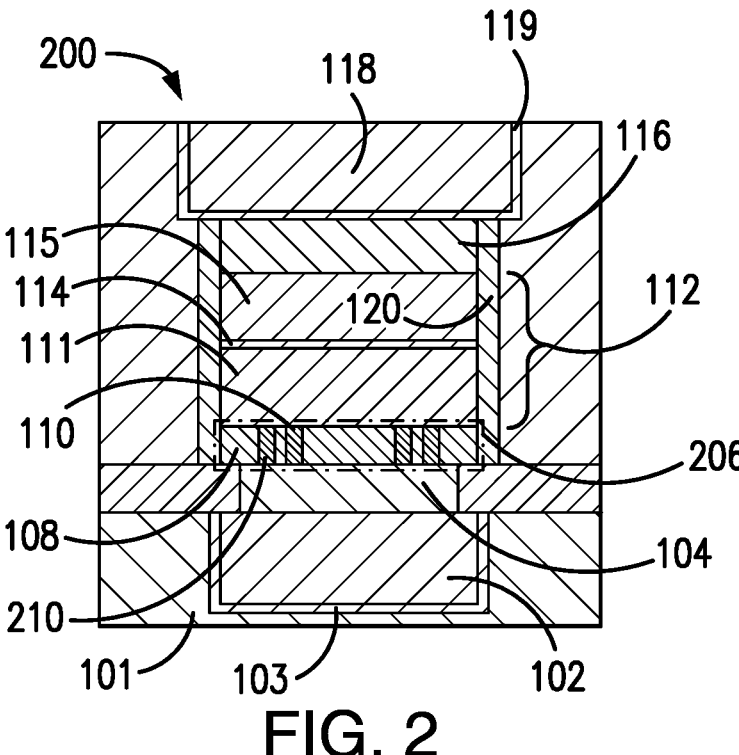
FIG. 2 depicts a schematic cross-sectional view of a MRAM structure having a bottom electrode with two conductive rings according to some embodiments of the present disclosure.

FIG. 1 depicts a schematic cross-sectional view of a MRAM structure 100 having a bottom electrode 106 with a single conductive ring 110 surrounded by a dielectric material 108. In some embodiments, the single conductive ring 110 is embedded in the dielectric material 108 such that it surrounds the dielectric material and is surrounded by the dielectric material. The bottom electrode 106 is disposed between the MTJ pillar 112 and the interconnect 102. The conductive rings (e.g., single conductive ring 110) described herein can be composed of metal nitride, such as TaN, TiN, or combination thereof. FIG. 2 depicts a schematic cross-sectional view of a MRAM structure 200 similar to the MRAM structure 100 described in FIG. 1, except the bottom electrode 206 of structure 200 includes two conductive rings 110, 210 surrounded by dielectric material 108 and spaced apart from one another by dielectric material 108. In some embodiments, the first conductive ring 110 surrounds a central portion composed of the dielectric material 108. Additional rings are also contemplated such that the outermost portion of the bottom electrodes are surrounded by dielectric material rather than a conductive material and each of the conductive rings are separated from one another by dielectric material 108. Without being bound by theory it is believed that additional conductive rings can reduce resistance relative to electrodes having a single ring. Moreover, additional rings having thin ring thickness can reduce topology at the interface between the bottom electrode and any MTJ layer of the MTJ pillar 112 disposed thereover. Having a uniform interface between the bottom electrode and MTJ pillar 112 enables enhanced performance of the final MRAM device.

Figure 3:
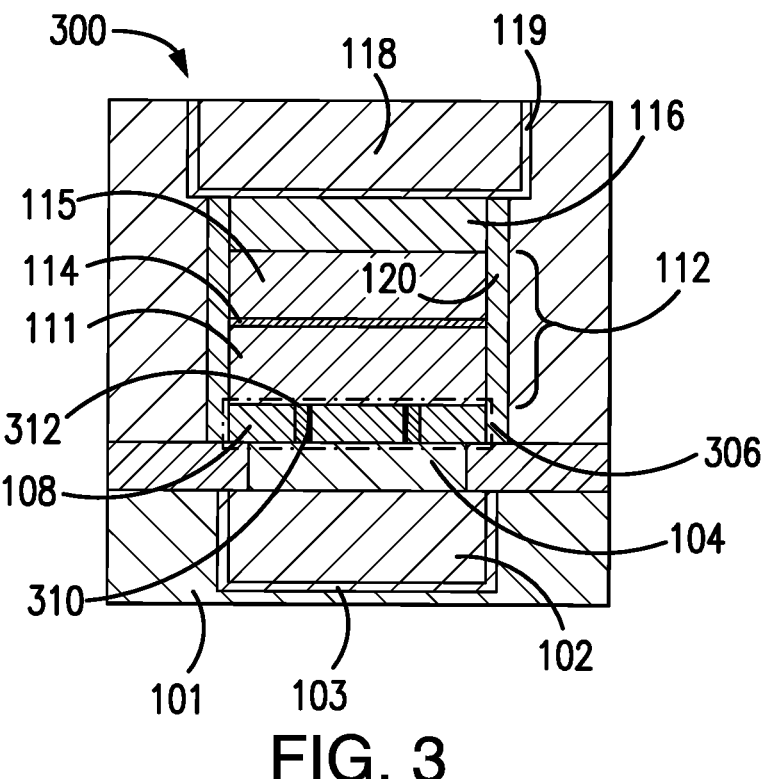
FIG. 3 depicts a schematic cross-sectional view of a MRAM structure having a bottom electrode with a single conductive ring with a nucleation ring according to some embodiments of the present disclosure.

FIG. 3 depicts a schematic cross-sectional view of a MRAM structure 300 similar to the MRAM structure 100 described in FIG. 1, except the bottom electrode 306 of structure 300 includes a single conductive ring 312 with a nucleation ring 310. In some embodiments, a conductive material having low resistivity is used for the conductive ring 312 depending on the predetermined use of the MRAM structure. It has been found that materials having low resistivity, such as ruthenium do not nucleate well on certain dielectric materials. A nucleation ring 310 is formed around a portion of the dielectric material 108 prior to forming the conductive ring 312 around the nucleation ring 310. The conductive ring 312 can be a metal such as Ru, Ta, W, Mo, Pt, or combination(s) thereof. The nucleation ring 310 can be a metal nitride, such as TaN, TiN, or combination thereof. The nucleation ring 310 can have a thickness of about 1 nm to about 3 nm. The conductive ring 312 can have a thickness that is about 2 to 10 times the thickness of the nucleation ring 310.

Figure 4:
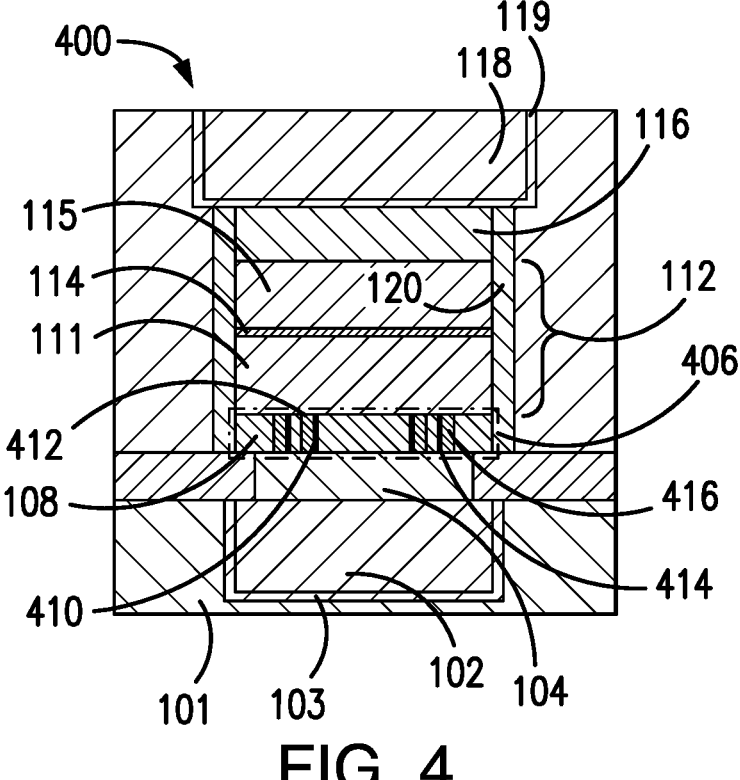
FIG. 4 depicts a schematic cross-sectional view of a MRAM structure having a bottom electrode with two conductive rings each with nucleation rings according to some embodiments of the present disclosure.
Figure 5:
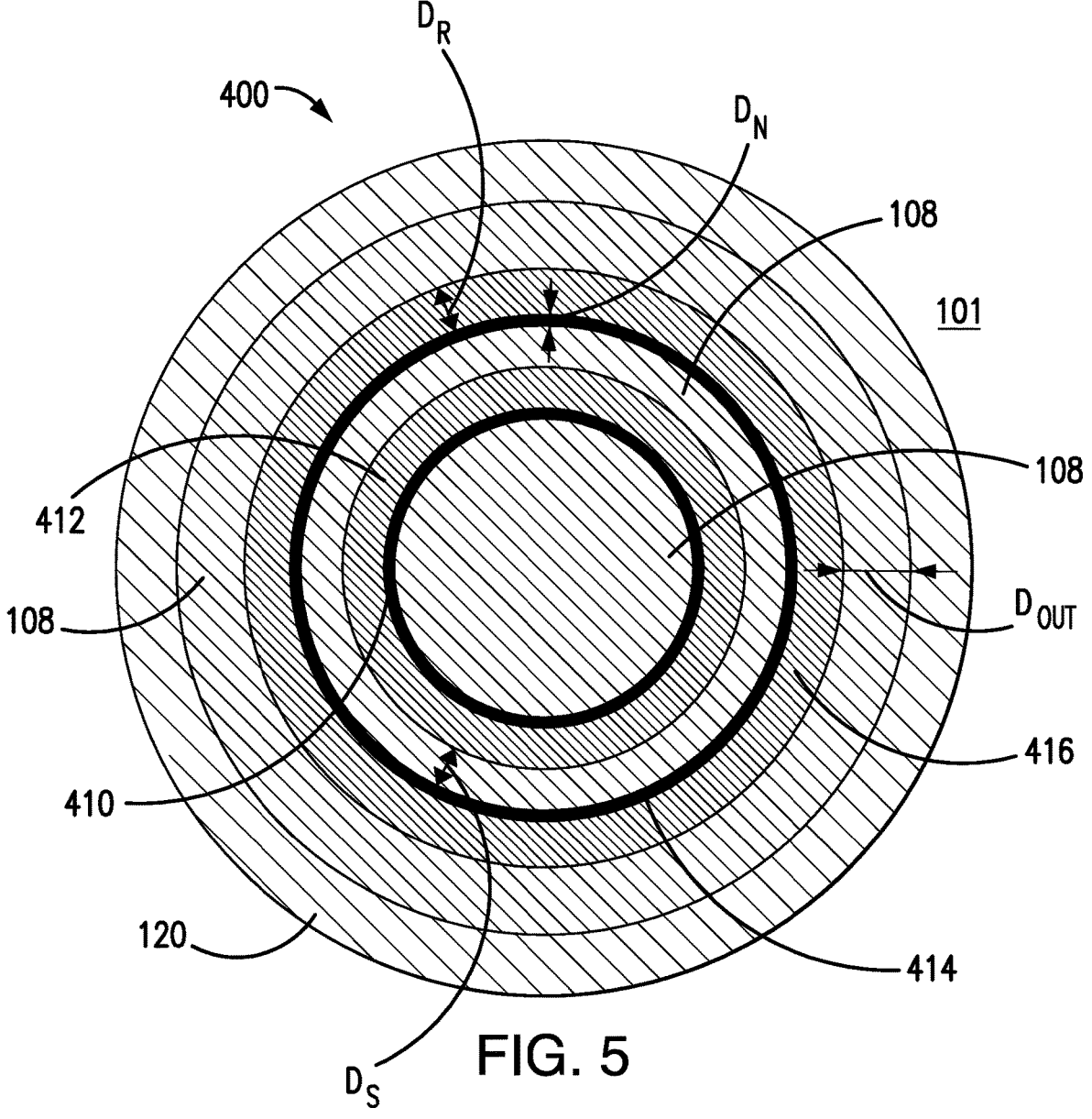
FIG. 5 depicts a schematic cross-sectional top down view of a MRAM structure having a bottom electrode with two conductive rings each with nucleation rings according to some embodiments of the present disclosure.

FIG. 4 depicts a schematic cross-sectional view of a MRAM structure 400 similar to the MRAM structure 300 described in FIG. 3, except the bottom electrode 406 of structure 400 includes two conductive rings 412, 416 with nucleation rings 410, 414. FIG. 5 depicts a top down, cross-sectional view of the MRAM structure 400 of FIG. 4. Additional rings are also contemplated such that the outermost portion of the bottom electrodes are surrounded by dielectric material rather than a conductive material. The conductive rings 412, 416 are concentric and separated by the dielectric material 408. Although circular rings are shown, in other embodiments, the rings could have other shapes such as a square or rectangular shapes when viewed from the top. In some embodiments, each ring can have a ring thickness DR of about 2 nm to about 20 nm, such as about 5 nm to about 15 nm, such as about 8 nm to about 12 nm. Each ring can have thicknesses DR that are uniform with respect to one another, or can vary with respect to one another. In some embodiments, an annular spacing DA between adjacent concentric rings can be about 2 nm to about 10 nm, such as about 5 nm to about nm. In some embodiments, a recessed distance Dour from the MTJ sidewall to the outermost ring is about 2 nm or more, such as about 5 nm or more. In some embodiments, a nucleation thickness Dx is about 1 nm to about 3 nm, such as about 2 nm.

Figure 6:
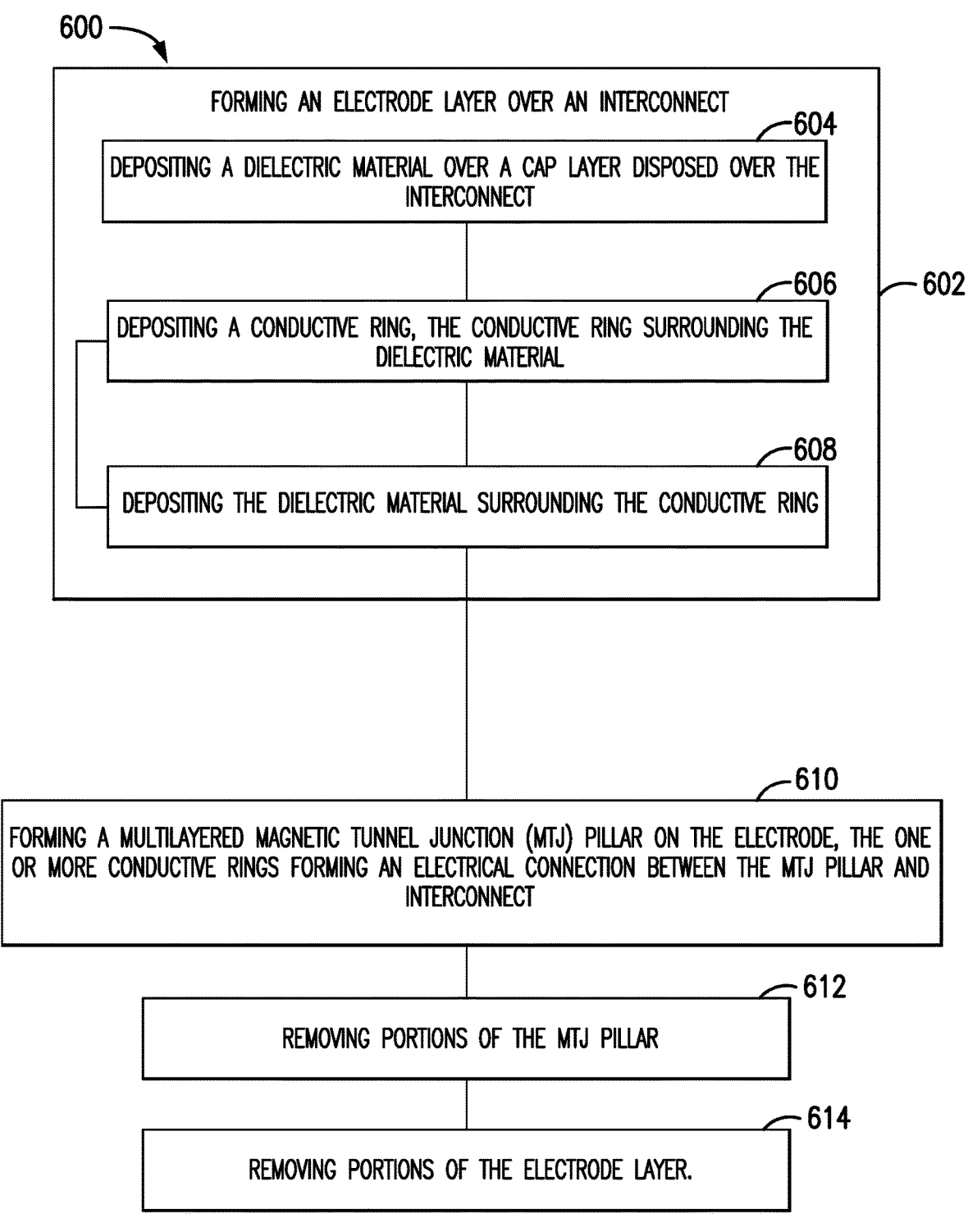
FIG. 6 is a block flow diagram of a method of forming an MRAM structure according to some embodiments of the present disclosure.

FIG. 6 is a block flow diagram of a method 600 of forming an MRAM structure according to some embodiments of the present disclosure. The method 600 includes, in block 602, forming an electrode layer over an interconnect. In some embodiments, block 602 can include performing each of blocks 604, 606, and 608 once. In some embodiments, block 602 can include block 604 and cyclically performing each of blocks 606 and 608 to provide a plurality of conductive rings. In block 604, a dielectric material is deposited over a cap layer disposed over the interconnect. In block 606, a conductive ring is deposited such that the conductive ring surrounds the dielectric material. In block 608, additional dielectric material is deposited surrounding the conductive ring. The method 600 includes, in block 610, forming a multilayered magnetic tunnel junction (MTJ) pillar over the electrode layer. The one or more conductive rings form an electrical connection between the MTJ pillar and the interconnect. In block 612, portions of the MTJ pillar are removed and in block 614, portions of the electrode layer are removed. Removing portions of the electrode layer in block 614 is free of re-sputtering of conductive material to the sidewall of the MTJ pillar. Removing portions the electrode layer during block 614 only removes the dielectric material of the electrode layer.

Figure 7:
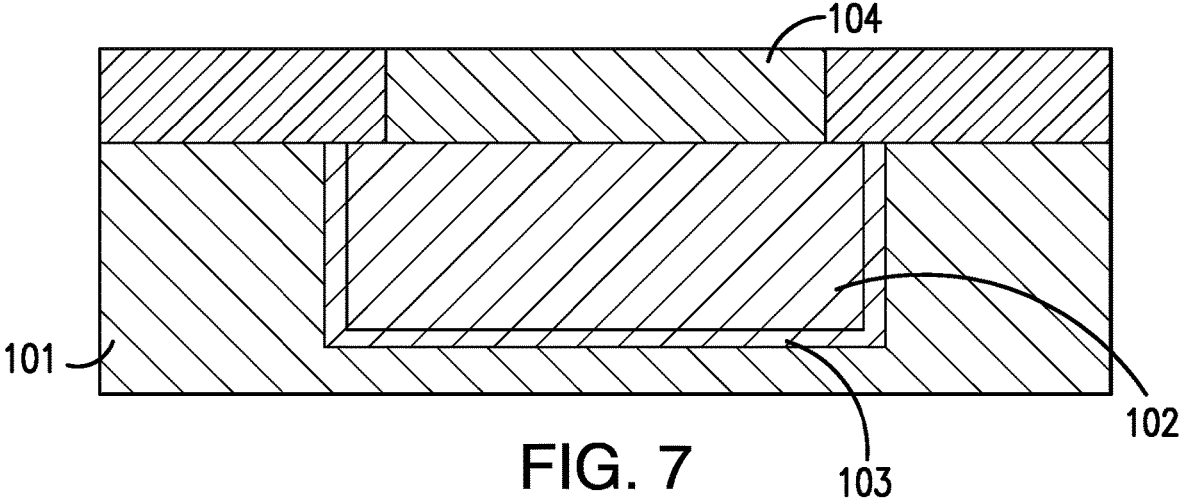
FIGS. 7 to 20 depict schematic cross-sectional views of various stages of forming an MRAM structure according to some embodiments.
Figure 8:
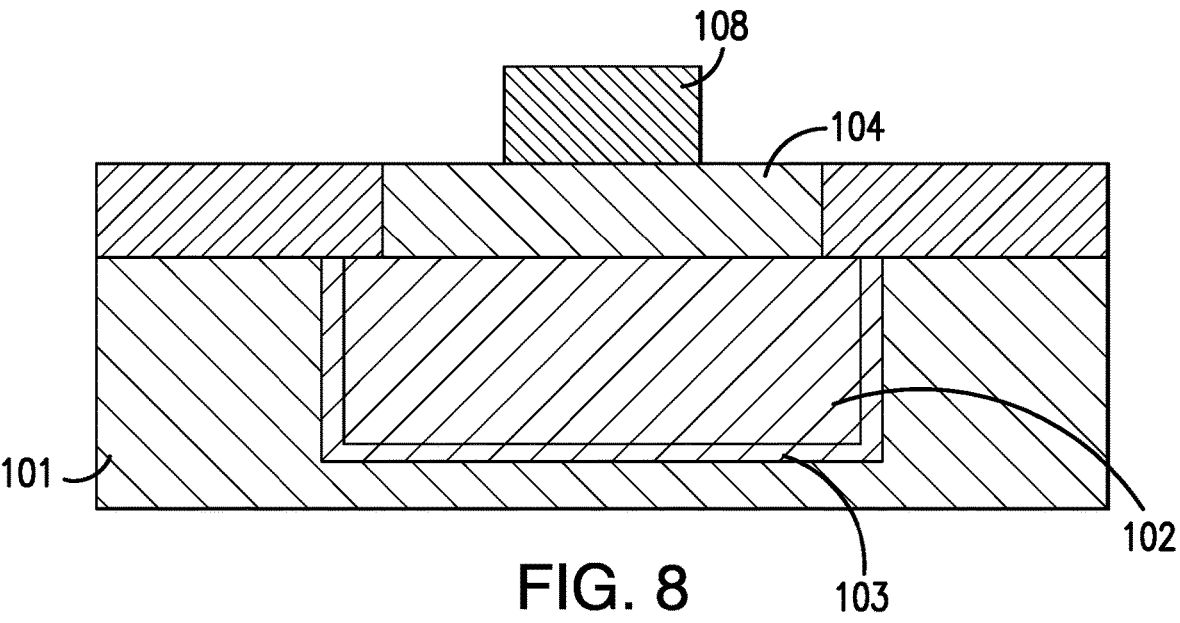
Figure 9:
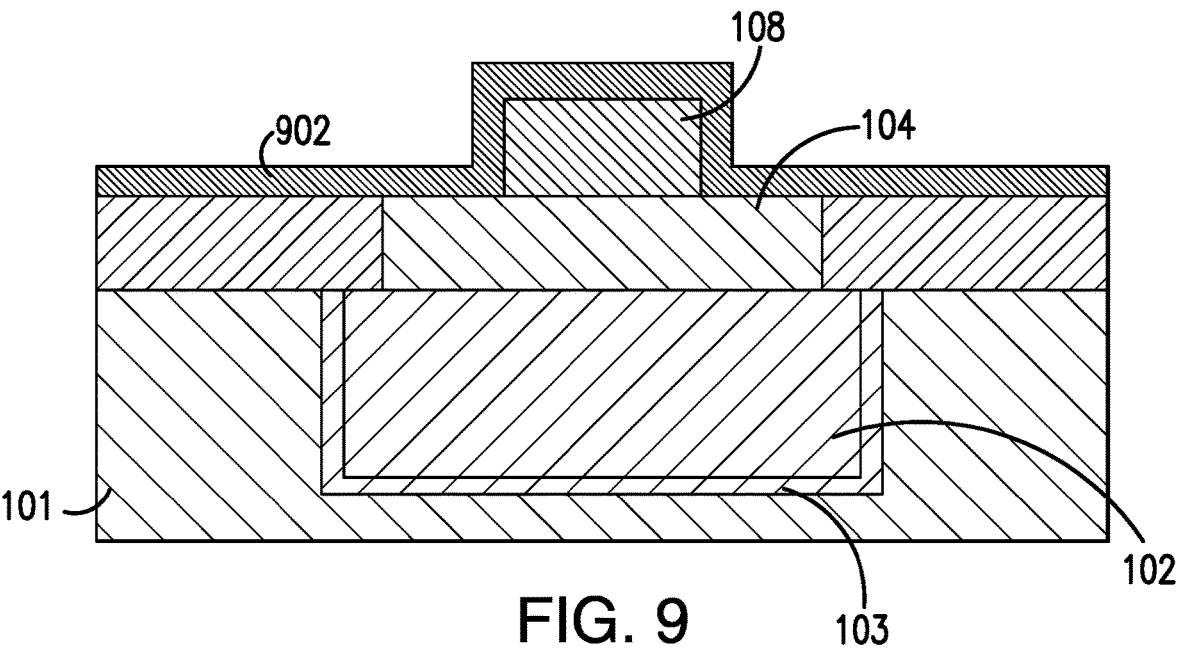
Figure 10:
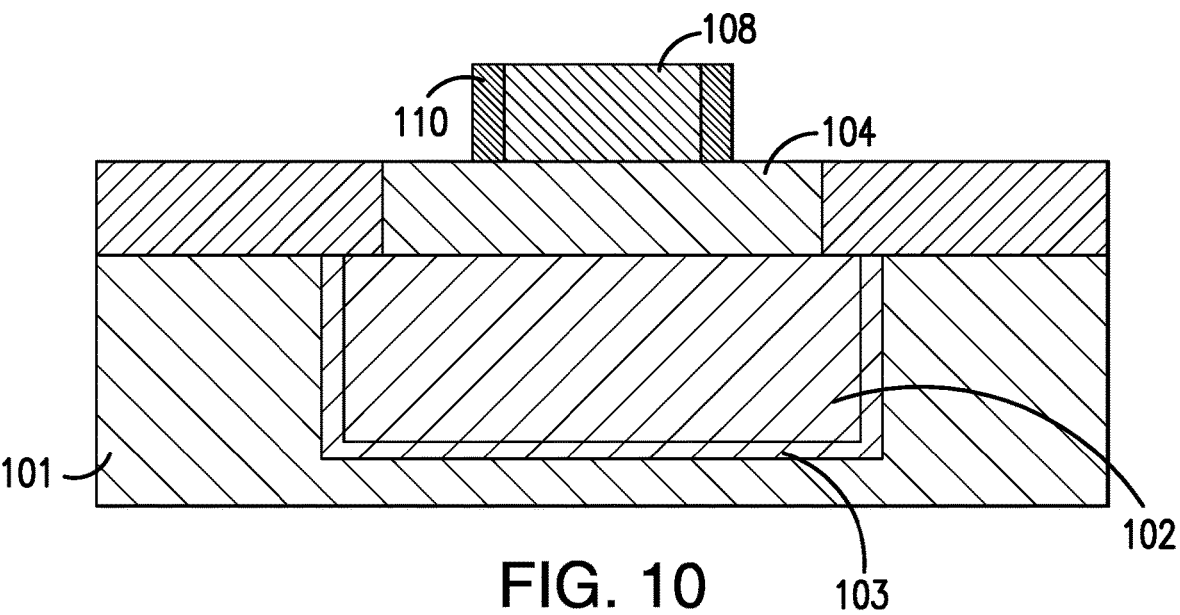
Figure 11:
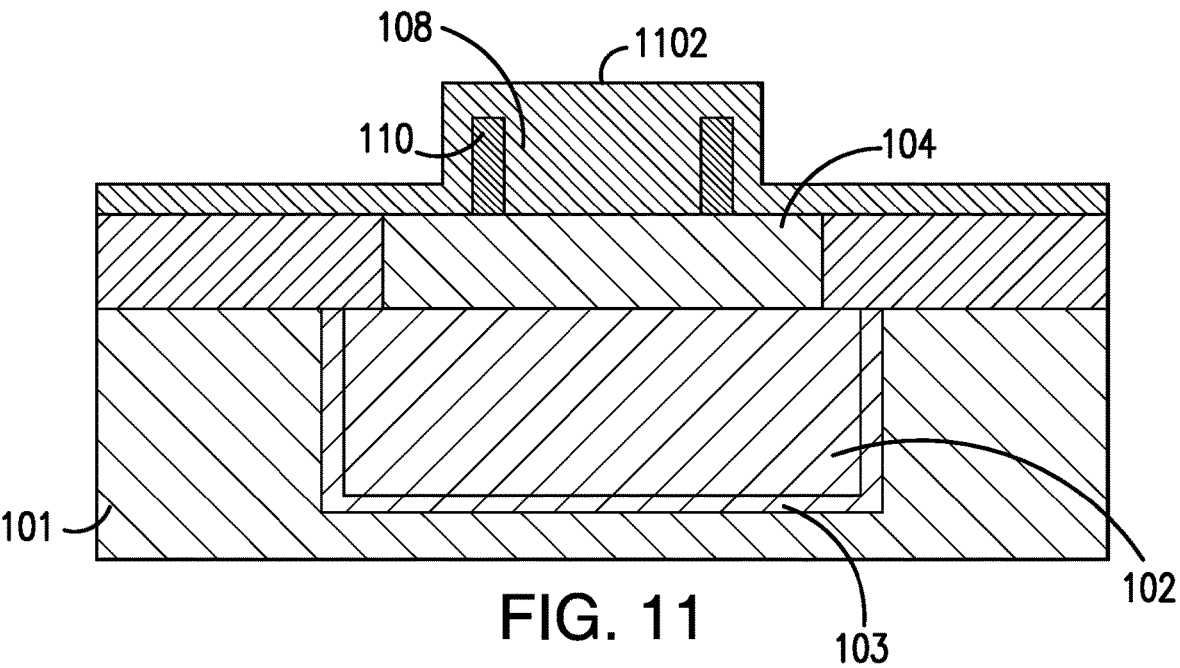

FIGS. 7 to 20 depict schematic cross-sectional views of various stages of forming an MRAM structure, such as structure 200 shown in FIG. 2. In FIG. 7, the interconnect 102 is formed in an ILD material 101. A cap layer 104 is formed over the interconnect 102. A bottom electrode is formed over the cap layer 104 as described in block 602 of method 600. As described by block 604, forming the bottom electrode includes depositing a dielectric material 108, such as silicon nitride, over the cap layer 104. As shown in FIG. 8, portions of the dielectric material 108 is removed such that surface portions of the cap layer 104 are exposed. Removing portions of the dielectric material 108 can include any process described herein, such as an etchback process such as reactive ion etching or ion beam etching. As shown in FIG. 9, a conductive material 902 is conformally deposited over the etched dielectric material, as described in block 606 of method 600. FIG. 10 depicts the conductive ring 110 after etching portions of the conductive material. The conductive ring surrounds a peripheral circumferential surface of the patterned dielectric material 108. In FIG. 11, the structure includes a dielectric material 1102 that is conformally deposited over the conductive ring 110, corresponding to block 608 of method 600.

Figure 12:
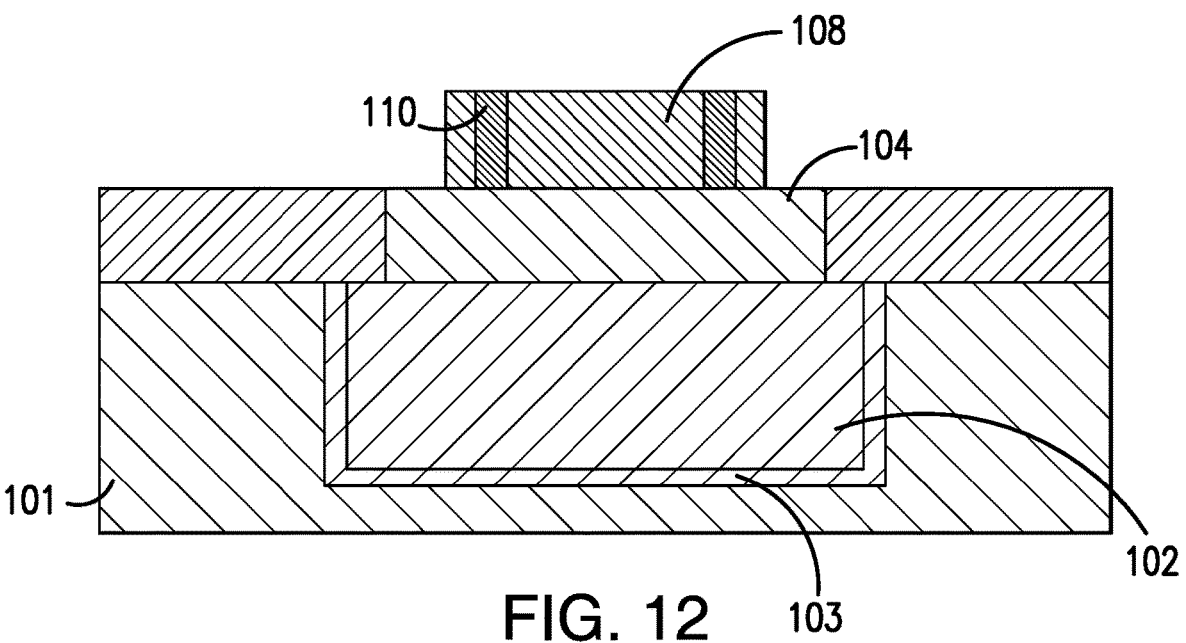
Figure 13:
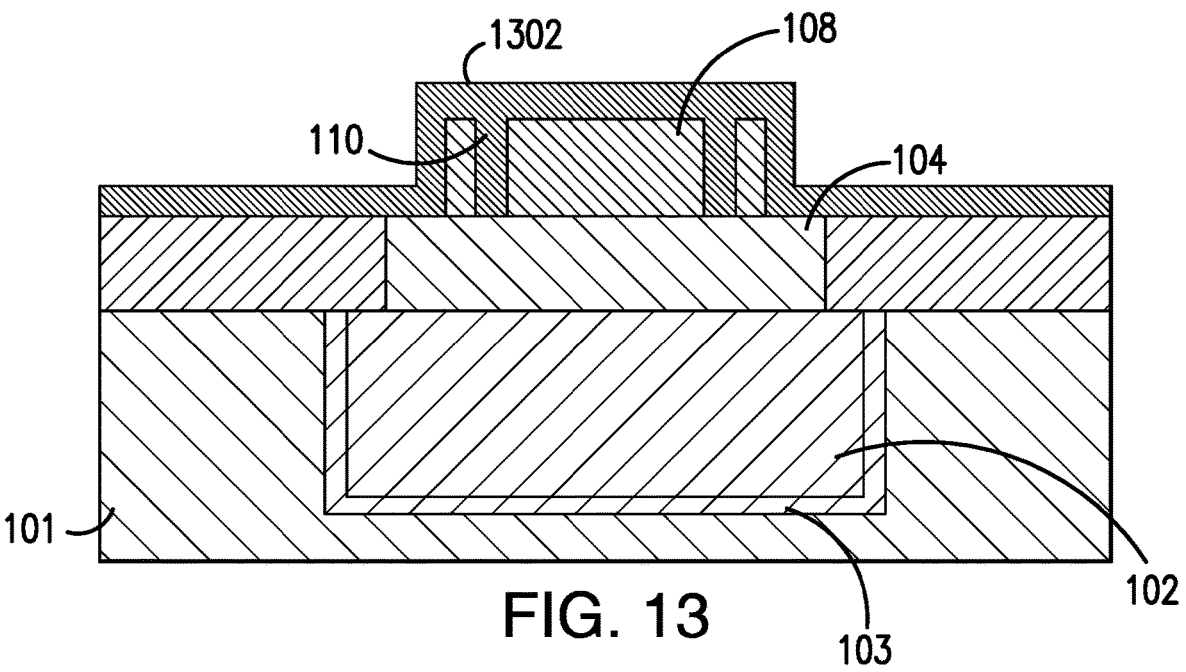
Figure 14:
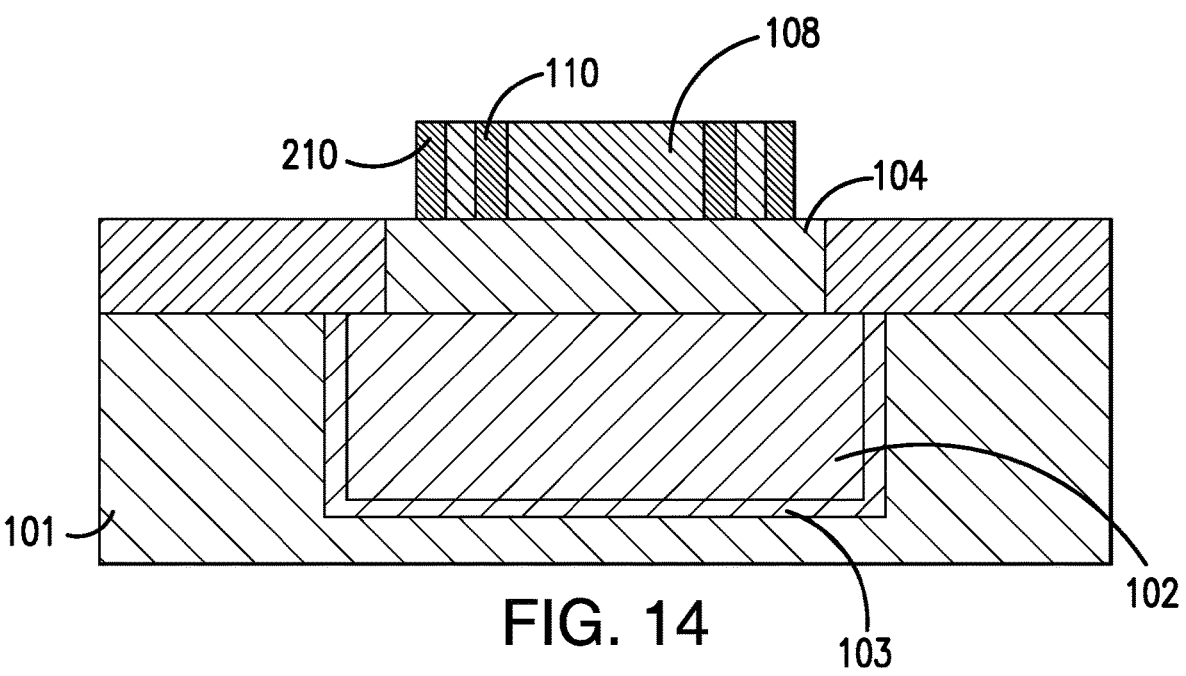
Figure 15:
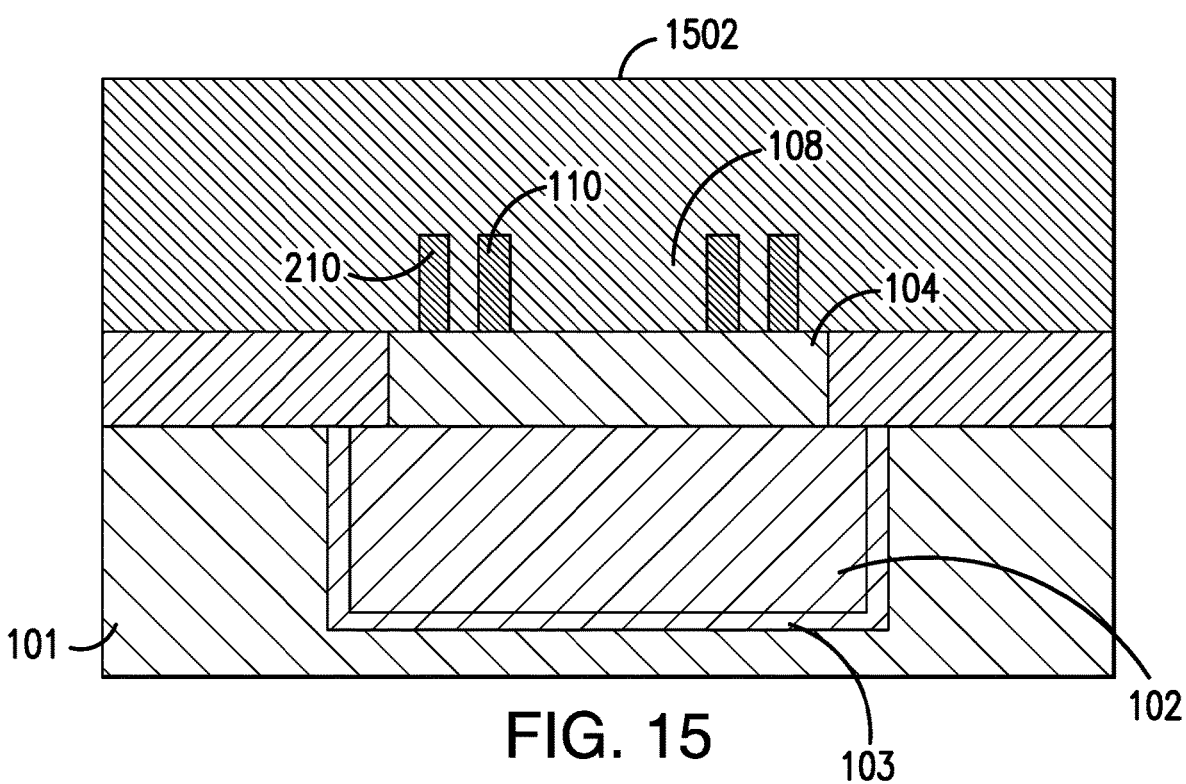
Figure 16:
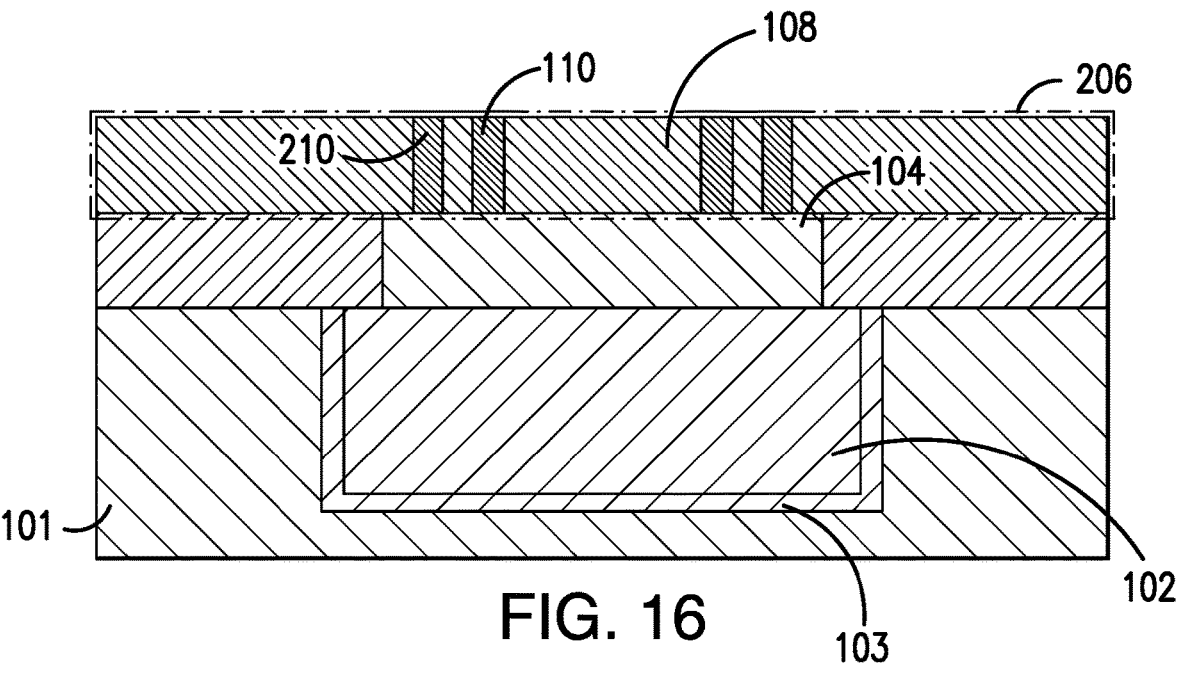
Figure 17:
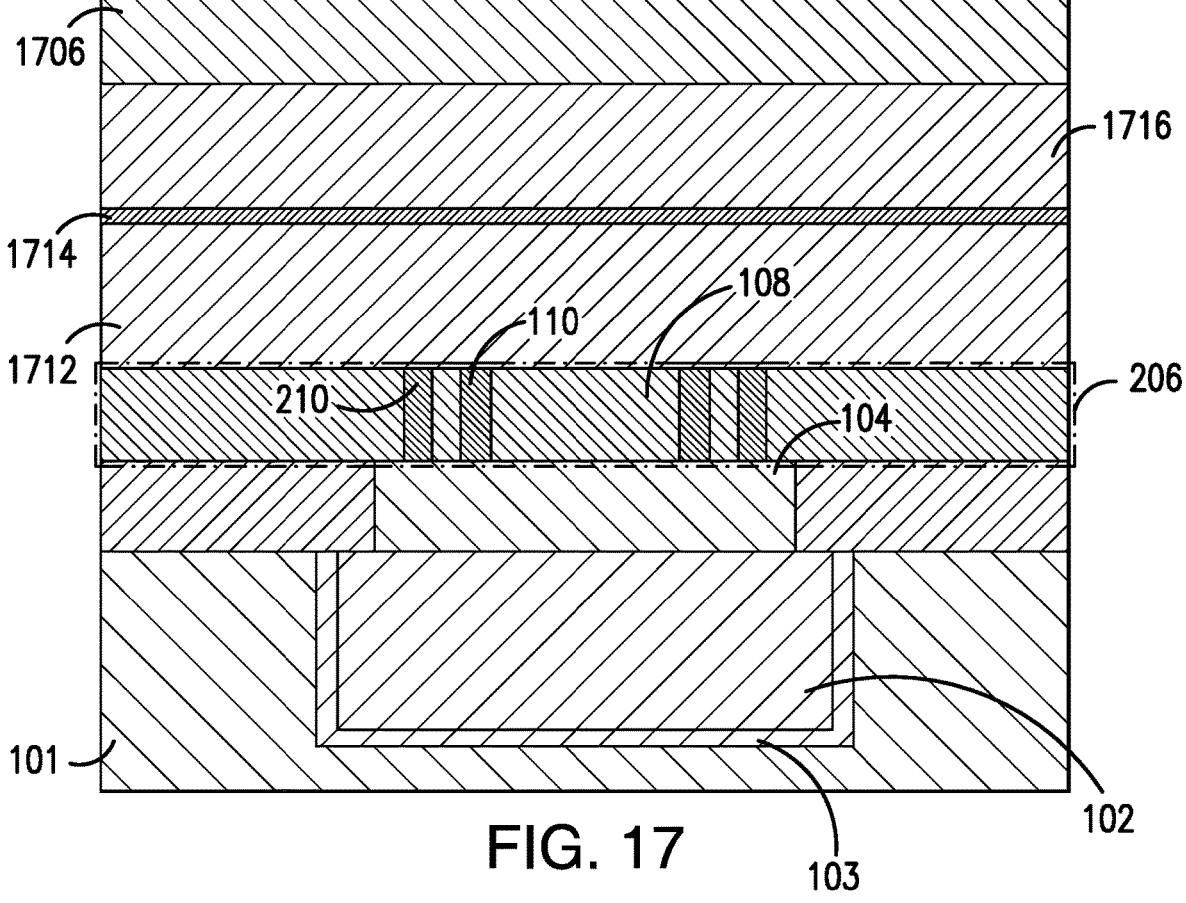
Figure 18:
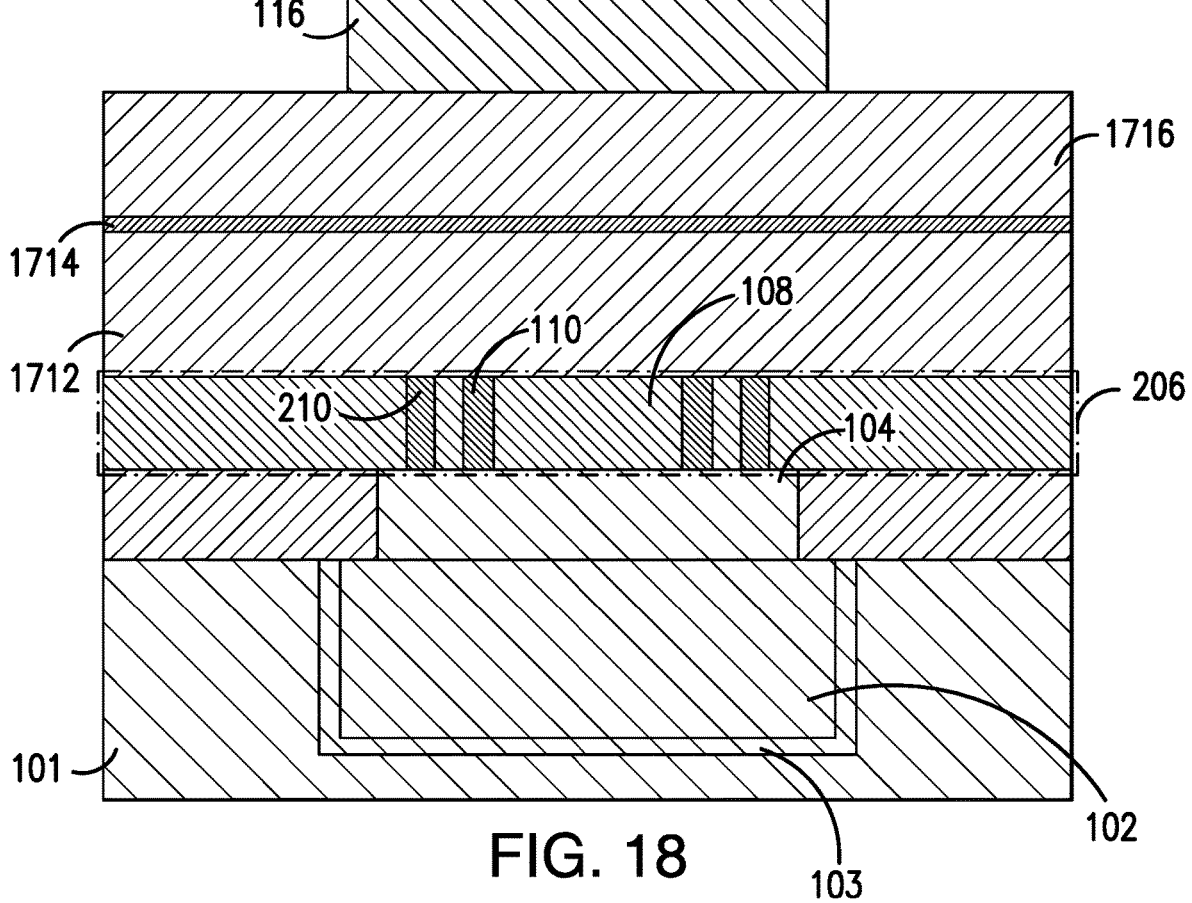
Figure 19:
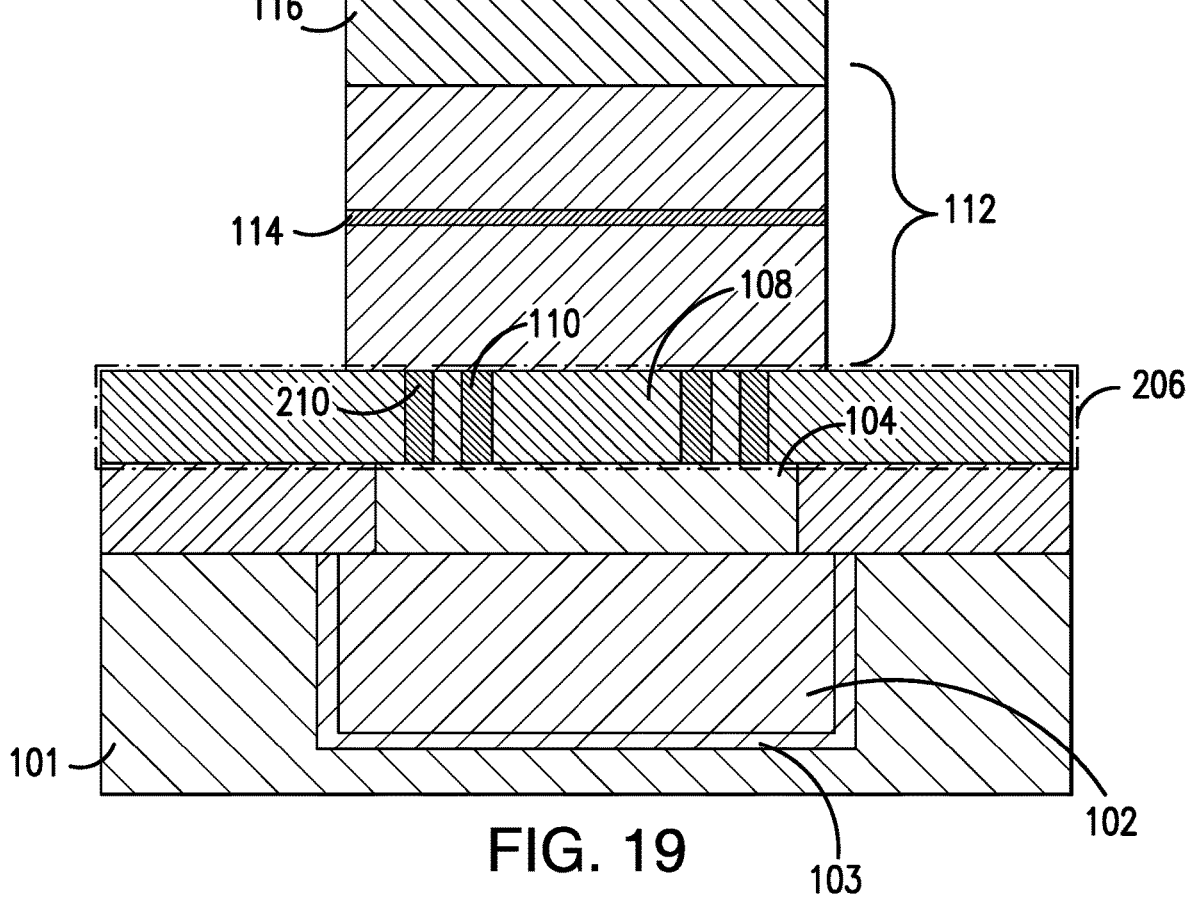
Figure 20:
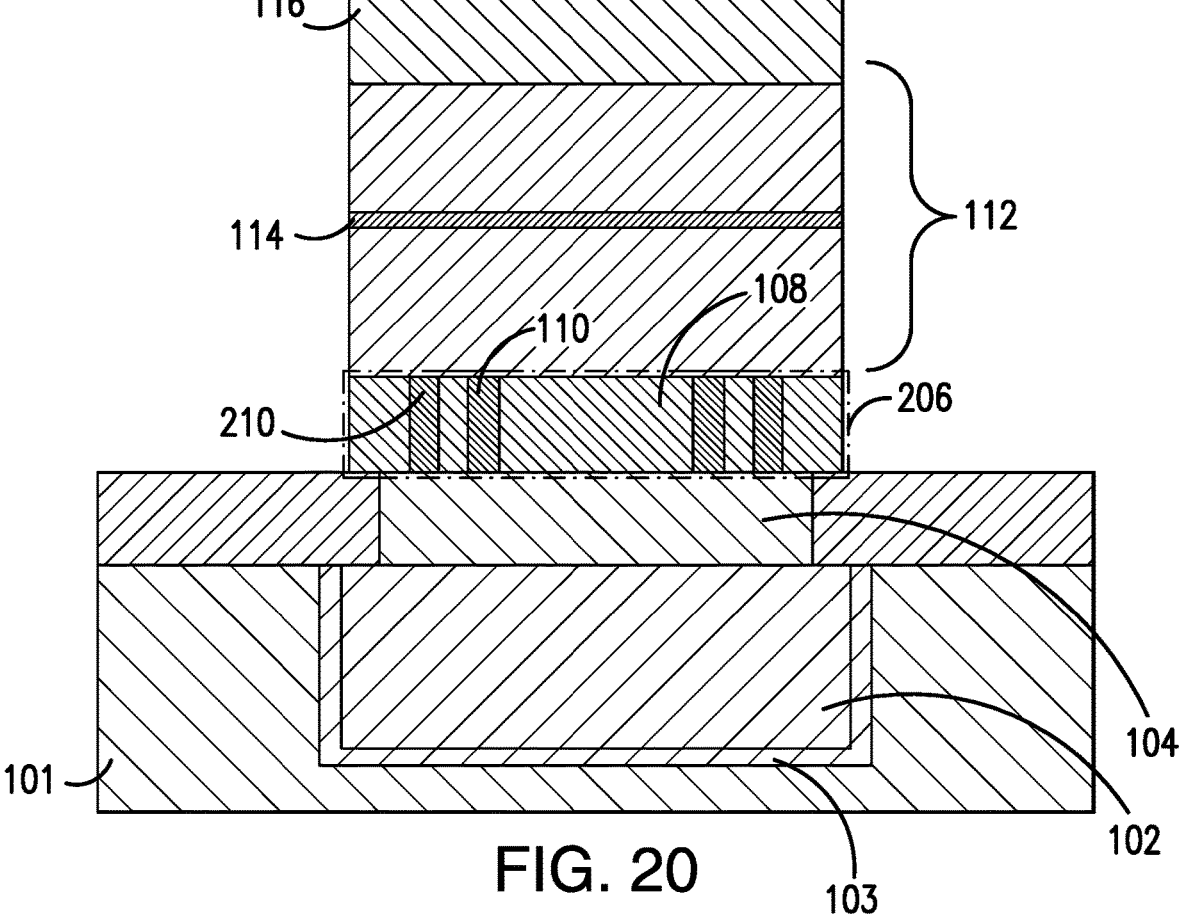

In FIG. 12, portions of the dielectric material are removed, such as by etchback process. In FIG. 13, a conductive layer 1302 is conformally deposited, corresponding to repeating block 606. In FIG. 14, portions of the conductive layer are removed to form a second conductive ring 210 which is concentric and spaced apart from first conductive ring 110 by the dielectric material. In FIG. 15, dielectric material is 1502 is conformally deposited over the dielectric material 108 and conductive rings 110 and 210. In FIG. 16, portions of the dielectric material 1502 are removed, such as by etchback, CMP, or combinations thereof. In FIG. 17, layers of an MTJ stack are deposited, such as a reference layer 1712, a tunnel barrier layer 1714, and a free layer 1716. Additional or other layers are also contemplated. A hard mask 1706 is deposited over the MTJ stack. In FIG. 18, the hard mask 1706 is patterned to form a patterned hard mask 116. In FIG. 19, the MTJ stack is patterned to form the MTJ pillar 112. In FIG. 20, portions of the bottom electrode layer are removed such as by an etchback process. The removed portion consists of the dielectric material and is free of conductive material. Referring back to FIG. 1, a dielectric encapsulation layer 120 is formed over the sidewall of the MTJ pillar and the bottom electrode and a top electrode 118 is formed over the MTJ pillar 112.

A single conductive ring embodiment corresponding to structure 100 of FIG. 1 can be formed using the same process and depictions shown and described relative to FIGS. 7 to 11. After depositing the dielectric material, described relative to FIG. 11, the dielectric material is partially removed, such as by etchback, CMP, or combinations thereof to form the bottom electrode layer. Blocks 610 and 612 of method 600 can be performed to deposit the MTJ layers and pattern the layers to form the MTJ pillar.

Embodiments having nucleation rings 410, 414 such as structure 300 shown in FIG. 3 and structure 400 shown in FIG. 4 can also be formed using the same method 600 shown in FIG. 6, except depositing the conductive ring of block 606 further includes forming a nucleation ring 410 around the dielectric material before forming a conductive ring 412 around the nucleation ring 410. For example, referring to FIG. 9, the nucleation ring 410 can be formed before depositing the conductive material 902 in FIG. 9. The nucleation ring 410 can be formed using conformal deposition and a removal process similar to the deposition and removal processes described herein.

The embodiments and methods described herein provide for a bottom electrode disposed below a MTJ pillar that enables electrode formation without re-sputtering conductive material on sidewall(s) of the MTJ pillars. The bottom electrode is composed of a dielectric material with one or more conductive rings embedded within the dielectric material such that the dielectric material surrounds the peripheral circumferential surface of the conductive ring such that the conductive ring is not etched during the patterning of the MTJ pillars. Thus, the conductive material of the ring is not re-sputtered onto the sides of the MTJ pillar 112 during the etching process illustrated in FIG. 20. The conductive ring can nucleation rings in order to incorporate low resistivity materials.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A magnetoresistive random access memory (MRAM) structure comprising:
   an interconnect; and
   a multilayered magnetic tunnel junction (MTJ) pillar disposed on the interconnect and having an outermost sidewall contacting multiple layers in the MTJ pillar, the MTJ pillar comprising an electrode layer electrically connecting the MTJ pillar to the interconnect, the electrode layer comprising an insulative material at an outermost portion of the electrode layer and a conductive material at a first inner portion of the electrode layer disposed radially inward from the outermost sidewall and the outermost portion of the electrode layer, wherein the insulative material directly contacts the outermost portion of the electrode layer and the outermost sidewall.

2. The MRAM structure of claim 1, wherein the insulative material is a dielectric material and the conductive material comprises a metal selected from Ru, Ta, Ti, W, Mo, Pt, and a combination thereof.

3. The MRAM structure of claim 2, wherein the dielectric material comprises a silicon nitride.

4. The MRAM structure of claim 1, wherein the electrode layer comprises a second inner portion of the electrode layer comprising the conductive material, wherein the second inner portion is disposed radially inward and concentric with the first inner portion, the first and second inner portion separated by the insulative material.

5. The MRAM structure of claim 4, wherein the electrode layer comprises a central portion disposed radially inward from the second inner portion, the central portion composed of the insulative material.

6. The MRAM structure of claim 4, wherein the first inner portion of the electrode layer interfaces a first nucleation layer at a first inner circumferential surface of the first inner portion.

7. The MRAM structure of claim 6, wherein the second inner portion of the electrode layer interfaces a second nucleation layer at a second inner circumferential surface of the second inner portion.

8. The MRAM structure of claim 1, wherein the first inner portion of the electrode layer interfaces a first nucleation layer at a first inner circumferential surface of the first inner portion.

9. A magnetoresistive random access memory (MRAM) structure comprising:

an interconnect;

an electrode disposed on the interconnect, the electrode comprising one or more conductive rings surrounded by a dielectric material at an outermost circumferential surface of an outermost conductive ring of the one or more conductive rings; and a multilayered magnetic tunnel junction (MTJ) pillar disposed on the electrode, the one or more conductive rings forming an electrical connection between the MTJ pillar and interconnect, wherein at least two of the one or more conductive rings are composed of different conductive material.

10. The MRAM structure of claim 9, wherein at least one conductive ring of the one or more conductive rings interfaces a nucleation layer at an inner circumferential surface of the at least one conductive ring.

11. The MRAM structure of claim 10, wherein the nucleation layer is composed of a metal nitride.

12. The MRAM structure of claim 11, wherein the metal is selected from Ru, Ta, W, Mo, Pt, and a combination thereof.

13. A method of forming a magnetoresistive random access memory (MRAM) structure, comprising:

forming an electrode layer on an interconnect, the electrode layer comprising one or more conductive rings surrounded by a dielectric material at an outer circumferential surface of the one or more conductive rings; and forming a multilayered magnetic tunnel junction (MTJ) pillar on the electrode layer and having an outermost sidewall contacting multiple layers in the MTJ pillar, wherein the one or more conductive rings form an electrical connection between the MTJ pillar and interconnect, and wherein the dielectric material directly contacts the outermost portion of the electrode layer and the outermost sidewall.

14. The method of claim 13, wherein forming the electrode layer comprises:

depositing the dielectric material over a cap layer disposed over the interconnect;

depositing a conductive ring of the one or more conductive rings, the conductive ring surrounding the dielectric material; and depositing an outer dielectric portion surrounding the conductive ring.

15. The method of claim 14, wherein depositing the dielectric material, the conductive ring surrounding the dielectric material, and the dielectric material surrounding the conductive ring is repeated cyclically, such that the conductive rings are separated from one another by the dielectric material.

16. The method of claim 14, further comprising:

etching the electrode layer between each depositing of the dielectric material and the conductive rings.

17. The method of claim 14, further comprising:

prior to depositing each of the conductive rings, depositing a nucleation layer surrounding the dielectric material.

18. The method of claim 14, further comprising:

depositing a hard mask over the MTJ pillar;

removing portions of the MTJ pillar to form an outer sidewall of the MTJ pillar; and removing portions of the electrode layer, wherein etching the electrode layer comprises etching only the outer dielectric portion of the electrode layer.

19. The method of claim 13, wherein forming the electrode layer, comprises atomic layer deposition, chemical vapor deposition, reactive ion etching, ion beam etching, or combinations thereof.

\* \* \* \* \*